United States Patent
Iser et al.

(10) Patent No.: US 8,243,955 B2
(45) Date of Patent: Aug. 14, 2012

(54) SYSTEM FOR ATTENUATING NOISE IN AN INPUT SIGNAL

(75) Inventors: Bernd Iser, Ulm (DE); Gerhard Schmidt, Ulm (DE); Mathias Roder, Bad Nauheim (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 232 days.

(21) Appl. No.: 12/727,045

(22) Filed: Mar. 18, 2010

(65) Prior Publication Data

US 2010/0239104 A1 Sep. 23, 2010

(30) Foreign Application Priority Data

Mar. 20, 2009 (EP) .................................. 09004056

(51) Int. Cl.
*H04B 15/00* (2006.01)
*G10L 19/14* (2006.01)
(52) U.S. Cl. ........................ 381/94.2; 704/225
(58) Field of Classification Search .............. 381/94.2, 381/94.1, 94.7, 94.3; 704/225, 224, 210, 704/219, 205, 206, 208
See application file for complete search history.

(56) References Cited

U.S. PATENT DOCUMENTS

| | | | |
|---|---|---|---|
| 4,628,529 A | 12/1986 | Borth et al. | |
| 5,544,250 A * | 8/1996 | Urbanski | 381/94.3 |
| 6,094,490 A | 7/2000 | Kim | |
| 7,366,294 B2 * | 4/2008 | Chandran et al. | 379/341 |
| 2006/0247923 A1 * | 11/2006 | Chandran et al. | 704/211 |
| 2009/0010452 A1 | 1/2009 | Unno et al. | |

FOREIGN PATENT DOCUMENTS

| | | |
|---|---|---|
| JP | 2003 052096 A | 2/2003 |
| WO | WO 96/13096 A1 | 5/1996 |

OTHER PUBLICATIONS

Nils Westerlund; "Speech enhancement for personal communication using an adaptive gain equalizer"; Signal Processing, vol. 85, No. 6; XP004862725; Jun. 1, 2005; pp. 1089-1101.

* cited by examiner

*Primary Examiner* — Hai Phan
(74) *Attorney, Agent, or Firm* — Brinks Hofer Gilson & Lione

(57) ABSTRACT

A noise attenuation system attenuates noise in an input signal. The system may estimate a power of the input signal, and determine a noise power value based on the input power estimate. The noise power value corresponds to an estimate of a noise power within the input signal. The system may determine an attenuation factor based on the noise power value, and attenuate the input signal by using the attenuation factor.

23 Claims, 9 Drawing Sheets

SYSTEM FOR ATTENUATING NOISE IN AN INPUT SIGNAL

BACKGROUND

1. Priority Claim

This application claims the benefit of priority from European Patent Application No. 09004056.9, filed Mar. 20, 2009, which is incorporated by reference.

2. Technical Field

This application relates to signal processing and, more particularly, to attenuating noise in an input signal.

3. Related Art

In a variety of situations, signals may be used to transmit information between two communication partners. Many different types of signals may be used to transmit information, including electric signals, radio signals, light signals, and sound signals. A signal may include both wanted signal components and noise components. The wanted signal components carry the information to be transmitted between communication partners, while the noise components may reduce signal quality or otherwise interfere with the intelligibility of the wanted signal components.

In a telephone system, a sound signal from a user maybe transformed at the sender side into an electric signal. The electric signal may be forwarded via electronic components of a telephone network to a receiver. At the receiver, the electric signal may be transformed back by electronic components into a wanted sound signal. If noise is present in the electric signal received at the receiver side, then artifacts may be audible in the resulting sound signal. Various electronic components in a telephone network, such as network access devices (NADs) or network access modules (NAMs), may add noise to the electric signal. The electronic components may generate noise even when no wanted signal component is present. The noise may be noticeable as artifacts to the receiving party, particularly during pauses of the wanted signal.

Some systems use noise gates, squelch functions, or Wiener-type filters to suppress noise. A noise gate may have the property of suppressing all input signals that have levels below a certain threshold, as shown in FIG. 10. In FIG. 10, an input signal with an intensity level below a gate threshold with an absolute value of 0.4 results in an output of level of zero (i.e., no output at all), while an input signal with an intensity level above the gate threshold may pass with unchanged intensity. Some noise suppression approaches may have a negative impact on the wanted signal components of an input signal. Therefore, a need exists for an improved noise attenuation system, which may have less of a negative impact on the wanted signal components of an input signal.

SUMMARY

A noise attenuation system attenuates noise in an input signal. The system may estimate a power of the input signal, and determine a noise power value based on the input power estimate. The noise power value corresponds to an estimate of a noise power within the input signal. The system may determine an attenuation factor based on the noise power value, and attenuate the input signal by using the attenuation factor.

Other systems, methods, features, and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
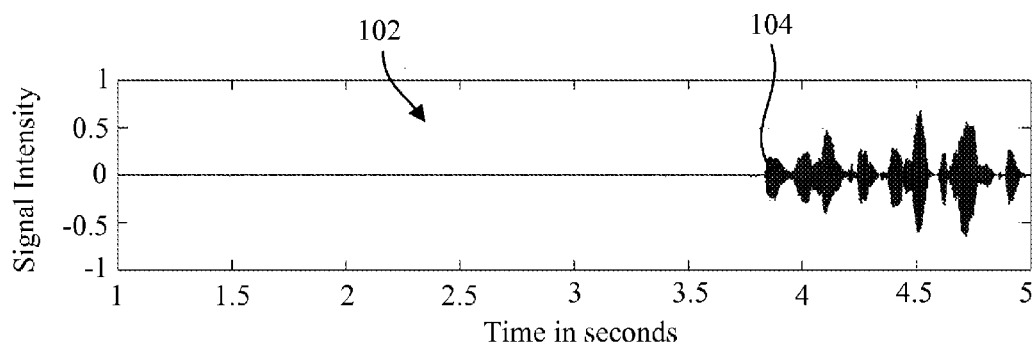
FIG. 1 illustrates an input signal.
Figure 2:
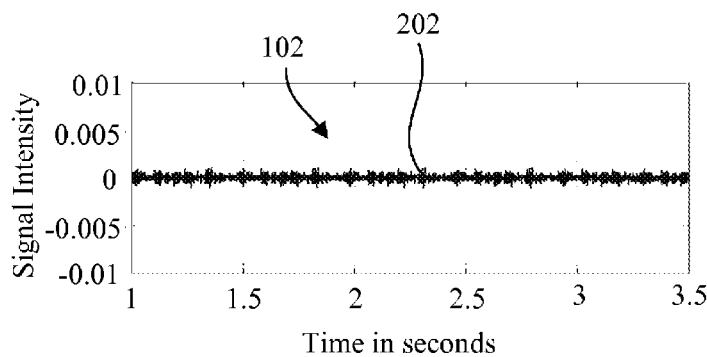
FIG. 2 illustrates a first representation of noise in the input signal of FIG. 1.
Figure 3:
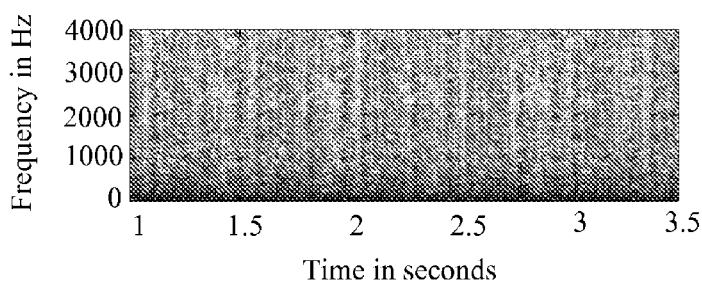
FIG. 3 illustrates a second representation of noise in the input signal of FIG. 1.

A noise attenuation system may attenuate undesirable noise in a signal. FIG. 1 illustrates a signal 102 with both wanted signal components 104 and noise components. The signal 102 may be transmitted from an electronic circuit that provides access to a network, such as a network access device (NAD). FIG. 1 shows the intensity of the signal 102 over time. While a wanted signal component 104 starts shortly before the $4^{th}$ second, no signal seems to be present at earlier times in FIG. 1. However, if the scale for the intensity value is enlarged, which is shown in FIG. 2, a noise component 202 may be recognized at times between second 1 and second 3.5 where no wanted signal component is present. FIG. 3 illustrates a time-frequency analysis of the noise component 202 of FIG. 2 over the first few seconds. A user receiving the signal 102 as an electric input signal to its telephone system or another sound reproducing system may hear the sound of the noise component 202 during an initial period before the wanted signal component 104 is received from the remote partner.

Figure 4:
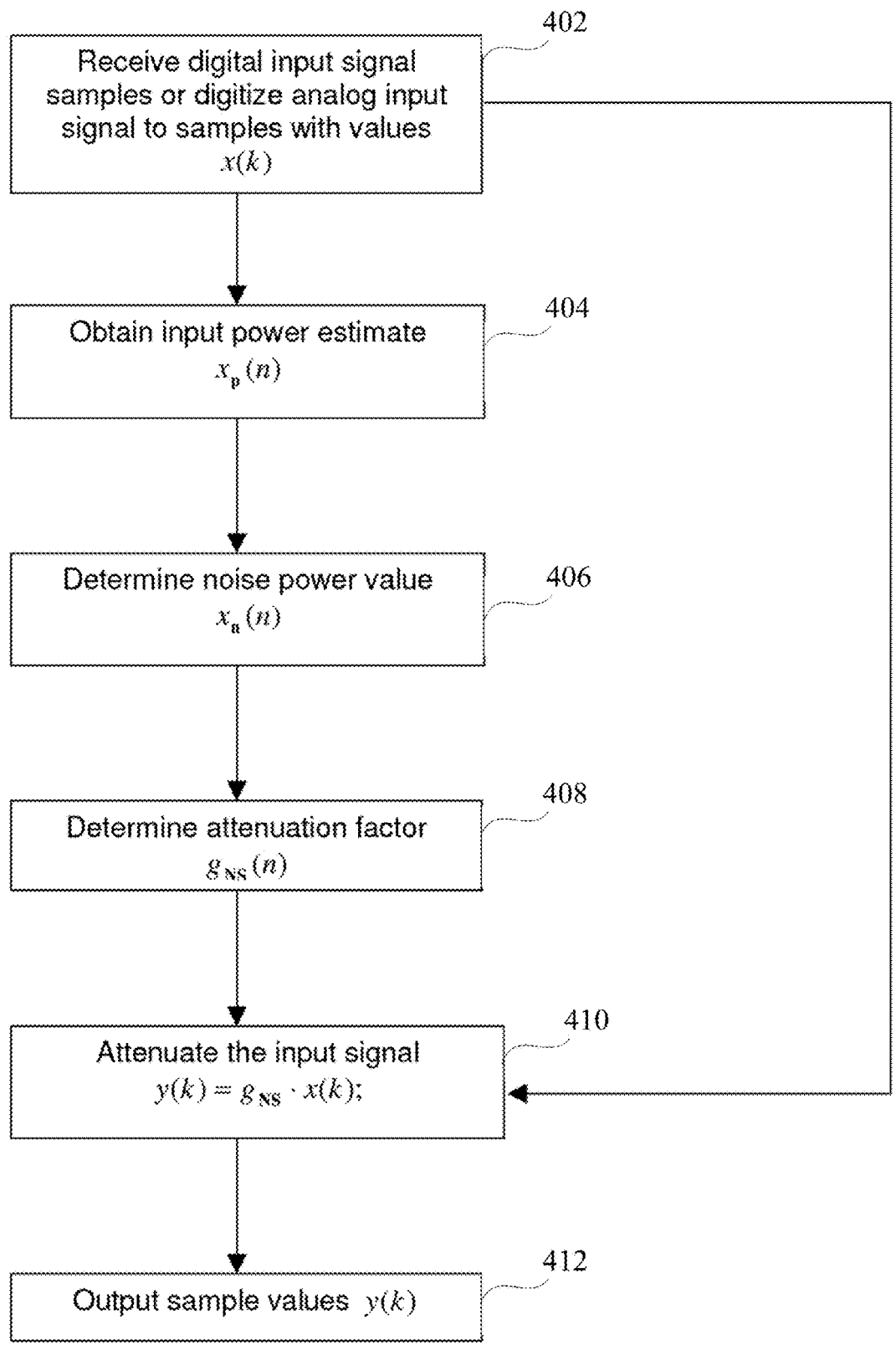
FIG. 4 illustrates a noise attenuation system attenuating noise in an input signal.

FIG. 4 illustrates the operation of a noise attenuation system. The noise attenuation system may receive the signal 102 of FIGS. 1-3 as the input signal. If the noise attenuation system receives the signal 102, the system may attenuate at least a portion of the noise component 202.

The noise attenuation system may estimate a power of an input signal and derive an estimate of the power of a noise component in the input signal from the power of the input signal. The system may use the noise power estimate to determine an attenuation factor dynamically in dependence on the estimated power of the noise component. In this way, the noise attenuation system may be more effective in adapting its attenuation behavior to the presence of noise. In particular, the noise attenuation system may attenuate noise during pauses of a wanted signal component in the input signal, particularly in low noise conditions, with less deterioration of the wanted signal component, as it may more clearly discern between noise and a wanted signal component with low power.

Figure 11:
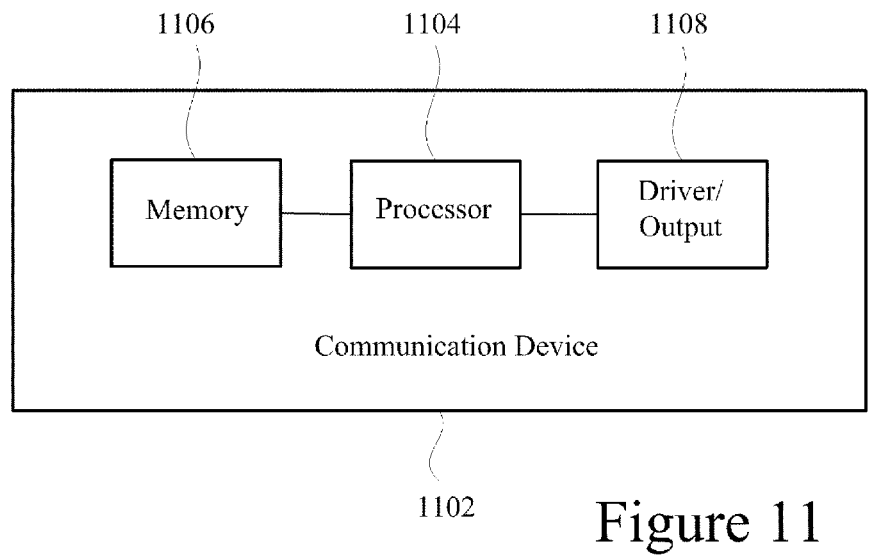
FIG. 11 is a noise attenuation system.
Figure 12:
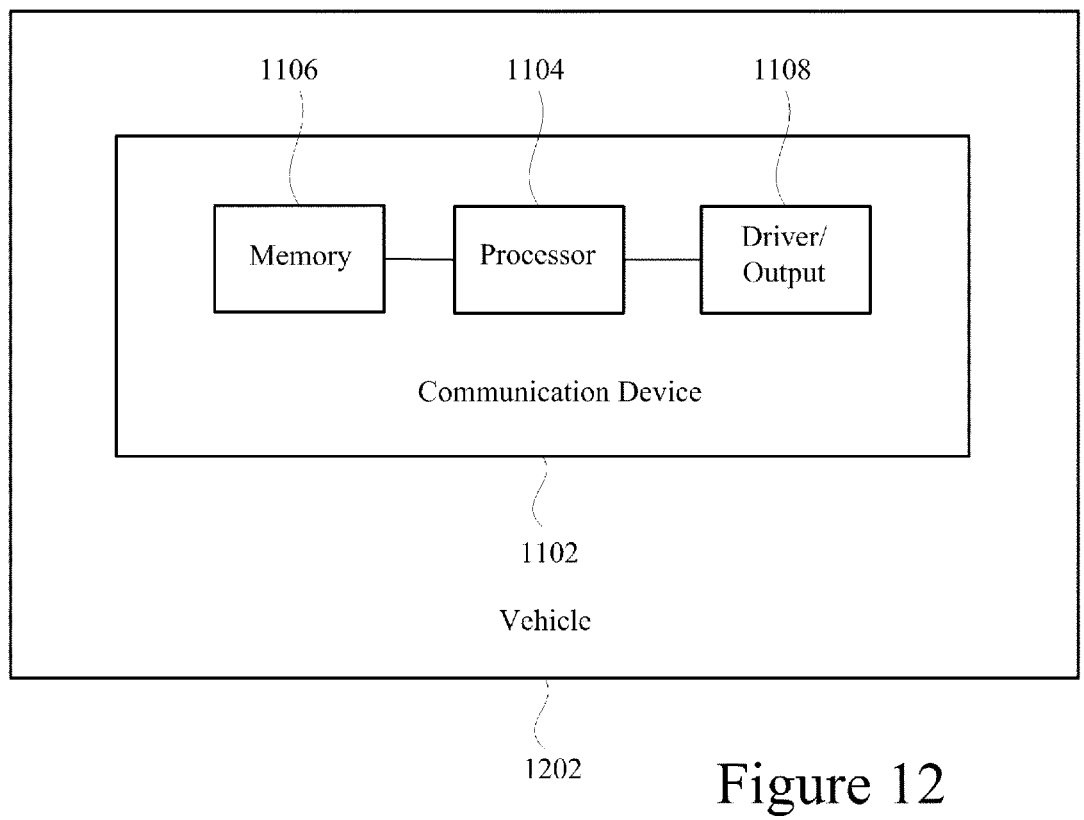
FIG. 12 is a noise attenuation system in a vehicle.

The noise attenuation system of FIG. 4 may be a part of a device that processes acoustic signals, such as a communication device. FIG. 11 illustrates a noise attenuation system within a communication device 1102. The noise attenuation system may include a processor 1104, a memory 1106, and a driver/output 1108, such as a transmitter, speaker, or device driver. The communication device may be a network access module, a mobile or landline telephone, a hands-free system, a portable or stationary radio system, a system for controlling devices via voice control, or another sound processing device. Alternatively, the input signal may be received from a network access module, such as a network access module of a telephone network, or a radio network. The noise attenuation system and/or the communication device may be installed in the cabin of a vehicle. Alternatively, the input signal may be received from a system that is physically or wirelessly linked to the cabin of a vehicle. FIG. 12 illustrates a noise attenuation system installed in a vehicle 1202, such as in the cabin of the vehicle. The input signal may include an acoustic signal from a microphone, from a device for reproducing recorded sound, such as a CD or a DVD player or a radio, or from a device giving spoken instructions to a user, such as an electronic navigation device or a system issuing speech prompts. The input signal may be received from a hands-free system.

In FIG. 4, an input signal is received at act 402. The input signal may include a noise component and a wanted signal component. In some applications, the noise component may have been added by an electronic component. When a wanted signal is processed by an electronic component, such as during transport through a network, the electronic component may add an electronic noise component to the wanted signal component. Electronic components generating noise may be devices that process and/or amplify acoustic or non-acoustic signals. In particular, such electronic components may be network access devices.

The input signal received at act 402 may be a digital signal or an analog signal. If the received input signal is a digital signal, the received input signal may be represented by a time-ordered sequence of samples or of blocks of samples. Alternatively, if the received input signal is an analog signal, act 402 may include digitizing the received input signal.

To digitize an analog signal, a parameter of the analog signal may be determined. In one implementation, the parameter may be the amplitude or the power of the input signal. The parameter of the signal may be determined at a plurality of successive times by a sampling process. In other words, the input signal may be sampled to obtain signal samples or samples. The successive times may be separated by substantially equal periods of time. Each sample may have a sample value corresponding to the respective signal parameter value (e.g., the respective amplitude or the power of the signal). The time at which a sample has been obtained is called the sample time. Samples may be ordered in time according to their sample times. A sequence of time-ordered samples may be called a digital signal.

The digital or digitized input signal may be a time-ordered sequence of samples with sample values x(k), where k is the index of the respective sample in the sequence of samples representing the input signal. The index k corresponds to the sample time where the sample value x(k) has been determined.

A time-ordered sequence of samples may be divided into blocks of samples. A block may include a fixed number of samples or a variable number of samples. In one implementation, a block may include only one sample. In other implementations, a block may include more than one sample. The input signal may be represented by a sequence of blocks which has been built from the sequence of samples. The corresponding sequence of blocks representing the signal may be ordered in time.

A block of samples may be assigned a block value representing the sample values in the block. The block value may be the average, or a weighted average, of the sample values of all or a part of the samples in the block, or may be the value of a selected sample from the block. Each block of samples may be assigned a block time representing the sample times of the samples in the block. The block time may be the sample time of one of the samples in the block (e.g., the first or the last one). The block time may be an average of the sample times of the samples in the block. Subsequent processing of the input signal may be determined for a sample or for a block of samples, such as at the sample time of the sample or the block time of the block. In one implementation, various signal processing quantities, such as an input power estimate, a noise power value, or an attenuation factor may be determined for a sample or for a block of samples.

The samples may be divided into consecutive blocks of $N_{block}$ successive samples. The blocks may be numbered by an index according to their order. In a first step, the average $x_{p,cur}(n)$ of the sample values of the samples in the n-th block (i.e., the block with index n) may be determined and assigned to the n-th block as the block value:

$$x_{p,cur}(n) = \frac{1}{N_{block}} \sum_{m=0}^{N_{block}-1} |x(nN_{block} - m)|. \quad (1)$$

At act 404, the noise attenuation system obtains an input power estimate for the input signal. The power of the input signal may be the modulus or the absolute value of the signal strength. Alternatively, the power of the input signal may be the square of the modulus of the signal strength of the input signal. In other implementations, the noise attenuation system may use another way of estimating the power of the input signal.

In one implementation, the sequence of sample values or block values representing the digital or digitized input signal may be smoothed in order to obtain the input power estimate. One sample or block of the smoothed sequence may correspond to one sample or block of the unsmoothed sequence. The corresponding samples or blocks may have the same sample time. For the smoothing, a first order Infinite Impulse Response (IIR) filter may be used. In this way, abrupt changes in the input signal may be removed before further processing of the input signal takes place.

The sequence of the block values $x_{p,cur}(n)$ may be smoothed using a first order Infinite Impulse Response (IIR) filter characterized by the parameters $\beta_{p,r}$ between 0 and 1 for increasing input signal power and $\beta_{p,f}$ between 0 and 1 for declining input signal power, thus obtaining the input power estimate $x_p(n)$ as:

$$x_P(n) = \begin{cases} \beta_{p,r}x_p(n-1) + (1-\beta_{p,r})x_{p,cur}(n), \text{ for } x_{p,cur}(n) > x_p(n-1), \\ \beta_{p,f}x_p(n-1) + (1-\beta_{p,f})x_{p,cur}(n), \text{ for } x_{p,cur}(n) \le x_p(n-1). \end{cases} \quad (2)$$

Figure 5:
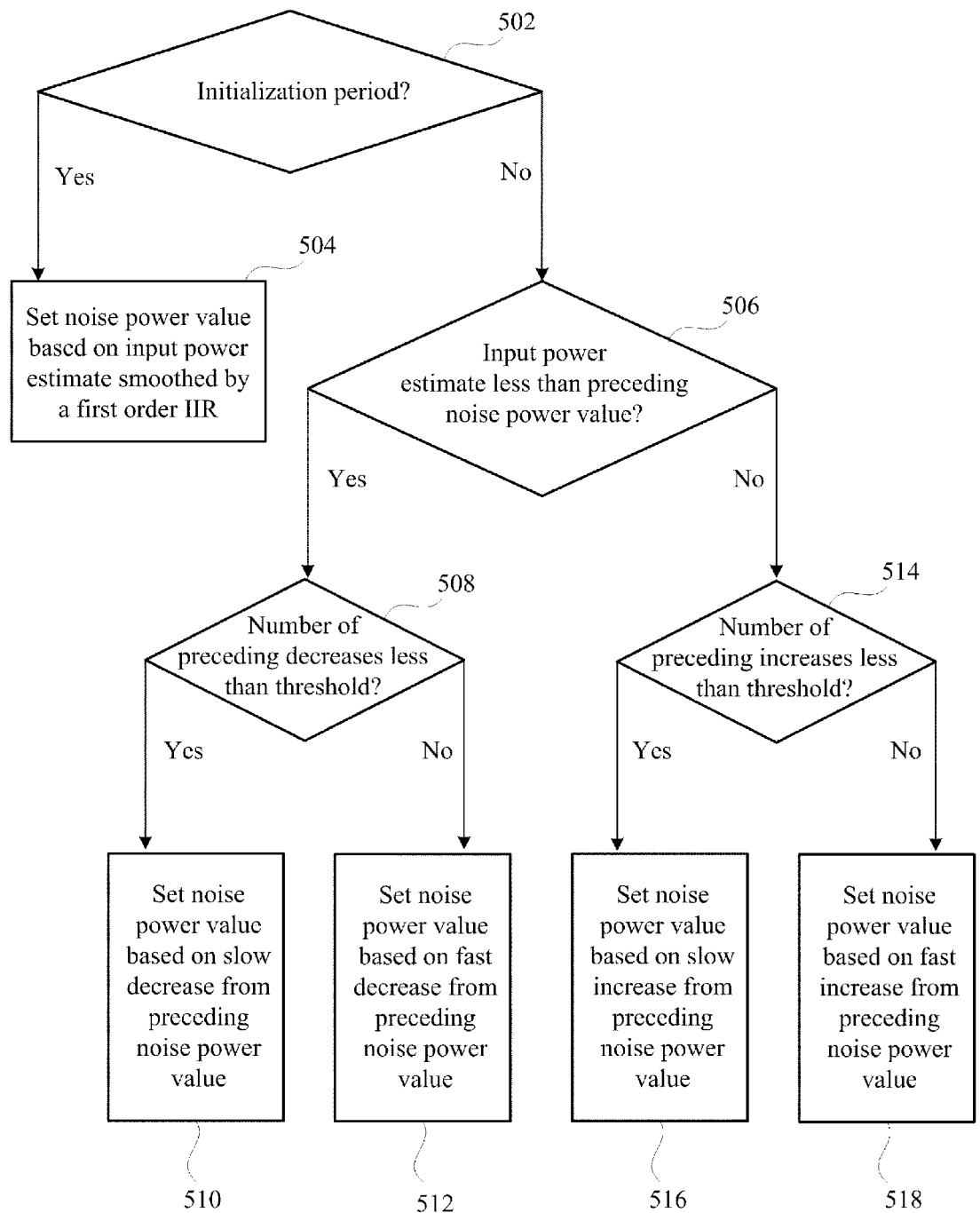
FIG. 5 is a method of determining a noise power value.

At act 406, the noise attenuation system determines a noise power value. The noise power value is represented as $x_n(n)$. The noise power value may be the modulus or the absolute value of the signal strength of a noise component. Alternatively, the noise power value may be the square of the modulus of the signal strength of a noise component. In other implementations, the noise attenuation system may use another way of estimating the power of a noise component. As will be described below, FIG. 5 illustrates further details of one implementation of a noise attenuation system that calculates a noise power value for an input signal.

Figure 6:
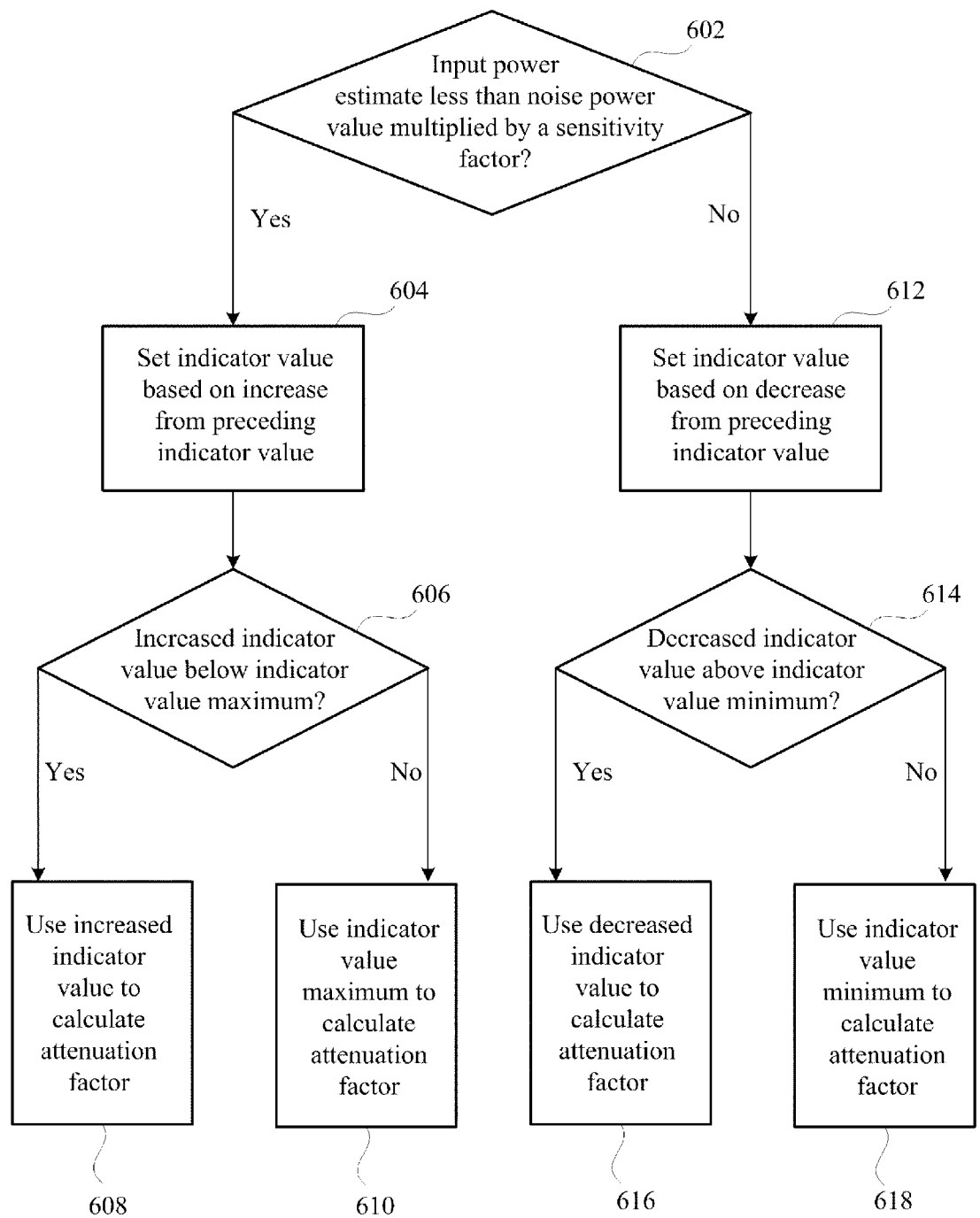
FIG. 6 is a method of determining an indicator value.
Figure 7:
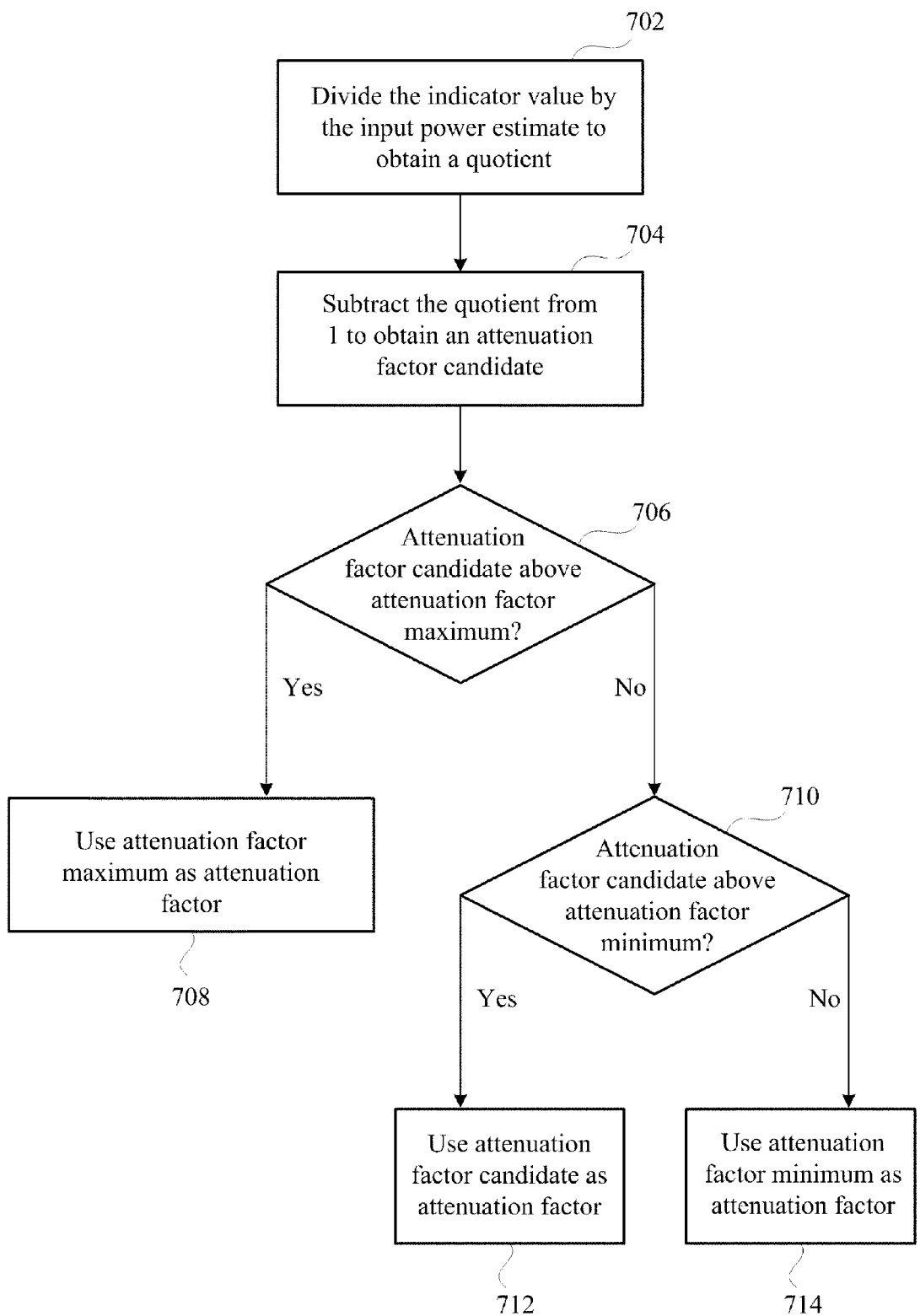
FIG. 7 is a method of determining an attenuation factor.

At act 408, the noise attenuation system determines an attenuation factor. The attenuation factor is represented as $g_{NS}(n)$. The attenuation factor may be based on the input power estimate. So, it becomes possible to react more flexibly to different input power levels. The attenuation factor may also be determined based on an indicator value that indicates the presence of a wanted signal component in the input signal at a given time. The indicator value may be based on the noise power value. The indicator value and/or the attenuation factor may be dependent on the input power estimate. As will be described below, FIG. 6 illustrates further details of one implementation of a noise attenuation system that calculates an indicator value for an input signal, and FIG. 7 illustrates further details of one implementation of a noise attenuation system that calculates an attenuation factor for the input signal.

At act 410, the noise attenuation system attenuates the input signal based on the attenuation factor. The system may include a noise attenuator that includes circuitry, a computer-readable storage medium with computer-executable instructions embodied thereon, or both. In one implementation, the noise attenuator may multiply the input signal by the attenuation factor to attenuate at least some noise in the input signal. Multiplying the input signal may comprise multiplying each of the samples of the digital or digitized input signal with the attenuation factor. The attenuation factor may be applied to a single sample or to all or a part of the samples in one or more blocks of samples. At act 412, the noise attenuation system outputs a noise reduced version of the input signal. The output signal is represented as y(k).

The noise attenuation system of FIG. 4 may be used to attenuate noise components during periods when the input power estimate of the input signal does not exceed the noise power value multiplied by a predetermined factor. The noise attenuation system may be applied to identify pauses in a wanted signal component of an input signal. The noise may be strongly reduced during pauses, while at times where a wanted signal component is present, the attenuation may be adapted to avoid deteriorating the wanted signal component. Particularly, the wanted signal component may be a speech signal component.

During a noise attenuation process, one or more of the acts 402-412 may be repeated multiple times. The acts 402-412 may be performed for one sample or block. In other words, the acts 402-412 may be performed at the same sample time or block time. In particular, if the input signal is represented by a sequence of samples or blocks of samples, the acts 402-412 may be performed for each sample or block of samples in the sequence.

FIG. 5 illustrates a method of determining a noise power value of an input signal. The noise power value may correspond to an estimate of the noise power component in the input signal. The system may derive the noise power value $x_n(n)$ from an input power estimate. In one implementation, the noise power value may be determined based on the input power estimate smoothed by a filter. The filter may be an Infinite Impulse Response (IIR) filter. The IIR filter may be of first order, or of a higher order. In particular, the noise power value may be equal to the input power estimate. Determining the noise power estimate based on the input power estimate smoothed by a filter may be performed for a single sample or block of samples having a sample time or a block time at a given time. The noise power estimate may be performed for a predetermined amount of samples or blocks of samples. The predetermined amount of samples or blocks may be the samples or blocks obtained directly after the method has been started. Alternatively or in addition, determining the noise power estimate based on the input power estimate smoothed by a filter may be performed for a fraction of the samples or blocks for which the method is performed. The fraction of samples may be distributed regularly or irregularly over all the samples for which the method is performed.

In one implementation, the noise power value $x_n(n)$ may be determined according to the following equation:

$$x_N(n) = \begin{cases} \beta_n x_n(n-1) + (1-\beta_n)x_p(n), \text{ for } n < n_{init} \\ \max\{\kappa_{dec,f} x_n(n-1), x_{n,min}\}, \text{ for } n \geq n_{init}, \\ \quad x_n(n-1) > x_p(n), \tau_{dec} > \tau_{dec,th} \\ \max\{\kappa_{dec,s} x_n(n-1), x_{n,min}\}, \text{ for } n \geq n_{init}, \\ \quad x_n(n-1) > x_p(n), \tau_{dec} \leq \tau_{dec,th} \\ \max\{\kappa_{inc,f} x_n(n-1), x_{n,min}\}, \text{ for } n \geq n_{init}, \\ \quad x_n(n-1) \leq x_p(n), \tau_{inc} > \tau_{inc,th} \\ \max\{\kappa_{inc,s} x_n(n-1), x_{n,min}\}, \text{ for } n \geq n_{init}, \\ \quad x_n(n-1) \leq x_p(n), \tau_{inc} \leq \tau_{inc,th}. \end{cases} \quad (3)$$

It can be seen from equation (3) that, during a predetermined initialization period $n<n_{init}$ with an $n_{init}>0$, i.e. dealing with blocks with an index $n<n_{init}$, the noise power value is based on the input power estimate, but smoothed by a first order Infinite Impulse Response (IIR) filter characterized by the parameter $\beta_n$. At act 502 of FIG. 5, the noise attenuation system determines whether the attenuation process is within an initialization period. The initialization period may last for a predetermined time, number of samples, or number of blocks. If the attenuation process is still within the initialization period, then the system determines the noise power value based on the input power estimate smoothed by a first order Infinite Impulse Response filter at act 504, such as according to equation (3). Alternatively, if the predetermined initialization period has past, then act 502 proceeds to act 506. At act 506, the attenuation system compares the current input power estimate to a preceding noise power value.

In one implementation, act 506 may include determining whether the input power estimate at a given time is larger than the noise power value at a previous time. In addition or instead, act 506 may include determining whether the input power estimate at a given time is smaller than or equal to the noise power value determined at a previous time. The input power estimate may be determined for a sample or block of samples where the sample time or the block time is the given time. The noise power value may be determined for a sample or block of samples preceding the sample or block of samples whose sample time or block time is the given time. The preceding sample or block of samples may be directly preceding or may be separated by a predetermined number of samples or blocks. The time interval between the given time and previous time may comprise sample times or block times of a fixed or variable number of samples or blocks.

The noise attenuation system may increase the noise power value at a given time if the input power estimate at the given time is larger than the noise power value at a previous time. In addition or instead, the noise power value at the given time may be increased if the input power estimate at the given time is equal to the noise power value at the previous time. The noise attenuation system may also decrease the noise power value at a given time if the input power estimate at the given time is smaller than the noise power value at a previous time.

In one implementation, the noise power value at a given time may be determined, based on the noise power value determined at a previous time, multiplied by an adjustment factor. The noise power value determined at a previous time may be determined for a sample or block of samples preceding the sample or block of samples whose sample time or block time is the given time. The preceding sample or block of samples may be directly preceding or may be separated by a predetermined number of samples or blocks. The time interval between the given time and the previous time may comprise sample or block times of a fixed or variable number of blocks of samples. The adjustment factor may be a constant, or may be time dependent. To permit adaptation of the method to a varying signal, the difference between the given time and the previous time may vary with time.

At act 506, the noise attenuation system determines whether to increase the noise power value or decrease the noise power value. As discussed above, the noise power value may be decreased if the input power estimate for a given time is less than the noise power value at a preceding time. The decrease of the noise power value may be performed at acts 508, 510, and/or 512. As discussed above, the noise power value may be increased if the input power estimate for a given time is greater than or equal to the noise power value at a preceding time. The increase of the noise power value may be performed at acts 514, 516, and/or 518.

After the predetermined initialization period, the input power value may be limited by the lower limit $x_{n,min}$. Similarly, the noise power value may be bounded below by a predetermined lower noise limit. The predetermined lower noise limit may be constant or time-dependent.

At a block index n where the input power estimate is smaller than the noise power value at the preceding block with index n−1, the noise power value may be reduced by a positive factor $\kappa_{dec,f}<1$ or $\kappa_{dec,s}<1$ depending on the number of preceding decreases $\tau_{dec}$ being more than a given threshold value $\tau_{dec,th}$, or not. The parameter $\kappa_{dec,s}$ realizes a slow decrease, while $\kappa_{dec,f}$, which is effective after a number $\tau_{dec,th}$ of slow decreases, has the effect of a fast decrease so as to follow larger changes in the input power estimate quickly. In the case that the input power estimate at a block index n is equal or larger than the noise power value at the preceding block with index n−1, the noise power value may show a corresponding behavior, e.g., the noise power value may be increased by a positive factor $\kappa_{inc,s}>1$ to cause a small increase when the number of consecutive increases is less or equal than $\tau_{inc,th}$, and the noise power value may be increased by the positive factor $\kappa_{inc,f}>1$ for a steeper increase after the number of consecutive increases exceeds $\tau_{inc,th}$.

In the process of FIG. 5, the noise attenuation system determines whether the number of preceding noise power value decreases is less than a threshold at act 508. If the number of decreases is less than the threshold, then the system sets the noise power value based on a slow decrease from the preceding noise power value at act 510. If the number of decreases is above the threshold, then the system sets the noise power value based on a fast decrease from the preceding noise power value at act 512. When the system is set to increase the noise power value, the noise attenuation system determines whether the number of preceding noise power value increases is less than a threshold at act 514. If the number of increases is less than the threshold, then the system sets the noise power value based on a slow increase from the preceding noise power value at act 516. If the number of increases is above the threshold, then the system sets the noise power value based on a fast increase from the preceding noise power value at act 518.

FIG. 6 illustrates a method of determining an indicator value. The indicator value may indicate the presence of a wanted signal component in the input signal at a given time. The indicator value may be based on the noise power value and/or the input power estimate. The noise attenuation system may adjust the indicator value over time to indicate whether various portions of the input signal are likely to contain wanted signal components. In one implementation, the indicator value is adjusted based on a comparison between the input power estimate and a product of the noise power value and a sensitivity factor. The sensitivity factor may be a predetermined constant, or may vary with time. The sensitivity factor may be dependent on the maximum and/or the minimum value of the input power estimate and/or of the noise power value in a period of time.

In one implementation, the indicator value may be used to discern between periods where the input power estimate of the input signal is higher than the noise power value, multiplied by a sensitivity factor $\alpha>0$, e.g., where the wanted signal component is predominant, and periods where this is not the case. In this context, the sensitivity factor $\alpha$ may be defined and the criterion may be established that a frame n is assumed to comprise a wanted signal component if the quotient between the input power estimate and the noise power value is greater than the sensitivity factor. Based on this criterion, the indicator value $x_{gate}(n)$ may be defined as follows:

$$x_{gate}(n) = \begin{cases} \max\{x_{gate,min}, \beta_{gate,f} x_{gate}(n-1)\}, \text{ for } x_p(n) > \alpha x_n(n) \\ \min\{x_{gate,max}, \beta_{gate,r} x_{gate}(n-1)\}, \text{ otherwise.} \end{cases} \quad (4)$$

From equation (4), it can be seen that $x_{gate}(n)$ decreases to a minimum value as long as the above criterion is met (e.g., as long as the input power estimate exceeds the product of the noise power value and the sensitivity factor). In this case, the indicator value may be decreased by the positive factor $\beta_{gate,f}<1$ for each consecutive block n until it reaches a minimum value $x_{gate,min}$ as long as the criterion for the presence of a wanted signal is met by consecutive blocks of samples. If the above criterion is not satisfied, then the indicator value may be increased by the positive factor $\beta_{gate,r}>1$ for each consecutive block n until an upper limit of $x_{gate,max}$ is reached. Values for $x_{gate,max}$ and $x_{gate,min}$ may be chosen to optimize the behavior of the attenuation factor. The value for the upper limit $x_{gate,max}$ may be chosen such that no noise is audible in periods where the input signal does not comprise any wanted signal component, while $x_{gate,min}$ may be selected such that the wanted signal component is not degraded in periods where a wanted signal component is present, even if a small amount of noise may still be audible.

In the process of FIG. 6, the noise attenuation system may determine whether to increase the indicator value or decrease the indicator value at act 602. If the input power estimate is less than the product of the noise power value and a sensitivity factor, then act 602 proceeds to act 604 and the indicator value is increased. Increasing the indicator value may include multiplying the indicator value determined at a previous time by a predetermined positive factor greater than one. The previous time may be the block time or the sample time of a block or sample which precedes the given time. The indicator value may also be increased if the input power estimate at the given time is equal to the product of the noise power value at the given time and the sensitivity factor.

If the input power estimate is greater than the product of the noise power value and a sensitivity factor, then act 602 proceeds to act 612 and the noise power value is decreased. Decreasing the indicator value may include multiplying the indicator value determined at a previous time by a predetermined positive factor smaller than one. The previous time may be the block time or the sample time of a block or sample which precedes the given time. The indicator value may also be decreased if the input power estimate at the given time is equal to the product of the noise power value at the given time and the sensitivity factor.

The indicator value may be bounded above by a predetermined indicator maximum value and/or may be bounded below by a predetermined indicator minimum value. The indicator maximum value and/or the indicator minimum value may be a predetermined constant or may be a predetermined function of the time. The indicator maximum value and/or the indicator minimum value may be a predetermined function of the input power estimate and/or of the noise power estimate.

If the signal power estimate is below the product of the noise power value and a sensitivity factor at a given time, the indicator value determined at a previous time may be increased and compared to the indicator maximum value. At act 606, the noise attenuation system compares the increased indicator value with an indicator value maximum. If the increased indicator value is less than the indicator value maximum, then the noise attenuation system uses the increased indicator value at act 608 to calculate an attenuation factor. If the increased indicator value is greater than the indicator value maximum, then the noise attenuation system uses the indicator value maximum at act 610 to calculate the attenuation factor. FIG. 7 illustrates further details of one implementation of a noise attenuation system that calculates an attenuation factor for the input signal.

If the signal power estimate is above and/or equal to the product of the noise power value and the sensitivity factor at a given time, the indicator value determined at a previous time may be decreased and compared to the indicator minimum value. At act 614, the noise attenuation system compares the decreased indicator value with an indicator value minimum. If the decreased indicator value is greater than the indicator value minimum, then the noise attenuation system uses the decreased indicator value at act 616 to calculate an attenuation factor. If the decreased indicator value is less than the indicator value minimum, then the noise attenuation system uses the indicator value minimum at act 618 to calculate the attenuation factor.

FIG. 7 illustrates a method of determining an attenuation factor. The attenuation factor may be based on the quotient of the indicator value and the input signal estimate. The attenuation factor may be time dependent. The attenuation factor may be based on the quotient of the squared moduli of the indicator value and the input signal estimate. In this way, a more abrupt distinction between the presence and the absence of a wanted signal component may be obtained. The attenuation factor may be equal to the squared moduli of the indicator value and the input signal estimate.

The attenuation factor may be bounded below by a predetermined attenuation minimum value and bounded above by a predetermined attenuation maximum value. The attenuation maximum and minimum values may be constant, or at least one of them may be time dependent. The attenuation maximum and minimum values may depend on the source for the input signal. Hence, it becomes possible to adapt the method more closely to the characteristics of the signal source. The attenuation factor may be time dependent. The attenuation factor may depend directly on the time, and/or the attenuation factor may depend on quantities which are time dependent. The attenuation factor may also be dependent on the input power estimate. Changes of the attenuation factor caused by changes of the indicator value may decrease with increasing input power estimate.

With the help of the indicator value, the attenuation factor $g_{NS}(n)$ may be:

$$g_{NS}(n) = \max\left\{g_{NS,min}, \min\left\{g_{NS,max}, 1 - \frac{x_{gate}(n)}{x_p(n)}\right\}\right\}. \tag{5}$$

From equation (5), it can be seen that the behavior of the attenuation factor is similar to that of the indicator value, but with an inverted trend. If a wanted signal component is present in the input signal, then the indicator value falls to low values while the input power estimate increases, and the term $$1 - \frac{x_{gate}(n)}{x_p(n)} \text{ gets}$$

close to 1 with the consequence that $$\min\left\{g_{NS,max}, 1 - \frac{x_{gate}(n)}{x_p(n)}\right\}$$

and hence, the attenuation factor get to the upper limit of $g_{NS,max}$, if the limits $g_{NS,max}, g_{min}$ are chosen correspondingly. In the absence of a wanted signal component in the input signal, the term $$1 - \frac{x_{gate}(n)}{x_p(n)}$$

will be close to zero and thus, the attenuation factor tends towards the lower limit of $g_{NS,min}$. In addition, it can be seen that when the input power estimate $x_p(n)$ is small, changes of the indicator value $x_{gate}(n)$ have a stronger effect on the attenuation factor $g_{NS}(n)$. At times where the input power estimate is high in comparison to the indicator value, changes of the indicator value cause small changes of the attenuation factor. In other words, changes in the indicator value have a stronger effect on the attenuation factor at times with low input power estimate. The attenuation factor described by equation (5) is well suited for attenuating noise at times where there is only a weak input signal or no input signal at all.

In the method of FIG. 7, the noise attenuation system may determine a quotient of the indicator value and the input signal estimate at act 702. For example, the system may divide the indicator value by the input power estimate to obtain the quotient. At act 704, the noise attenuation system may subtract the quotient from 1 to obtain an attenuation factor candidate. At act 706, the system compares the attenuation factor candidate to an attenuation factor maximum. If the attenuation factor candidate is above the maximum, then the system uses the attenuation factor maximum as the attenuation factor at act 708. If the attenuation factor candidate is below the maximum, then act 706 proceeds to act 710. At act 710, the system compares the attenuation factor candidate to an attenuation factor minimum. If the attenuation factor candidate is above the minimum, then the system uses the attenuation factor candidate as the attenuation factor at act 712. If the attenuation factor candidate is below the minimum, then the system uses the attenuation factor minimum as the attenuation factor at act 714.

Having determined the attenuation factor, the input signal may be attenuated by using the attenuation factor. The input signal may be attenuated by multiplying the k-th sample value x(k) with the attenuation factor which may be derived from the data block n to which the data sample belongs. In this way, an output signal sample value y(k) is obtained as:

$$y(k) = g_{NS}\left(\left\lceil \frac{k}{N_{block}} \right\rceil\right) x(k). \quad (6)$$

In equation (6), the operator $\lceil \; \rceil$ denotes the next integer number greater or equal to its argument. In this way, the attenuation factor may be applied to the samples of the input signal using the original rate of samples, even if the attenuation factor is derived from blocks of samples of the size $N_{block}$.

The effect of the attenuation factor $g_{NS}$ on the input signal x(k) is similar to a scalar version of a Wiener filter. So, in another implementation, squared values may be used in the attenuation factor, such that $g_{NS}(n)$ comprises the quotient $$\frac{|x_{gate}(n)|^2}{|x_p(n)|^2} \text{ or } \frac{x_{gate}^2(n)}{x_p^2(n)}.$$

However, the attenuation factor according to equation (6) provides a more gentle suppression characteristic.

Figure 8:
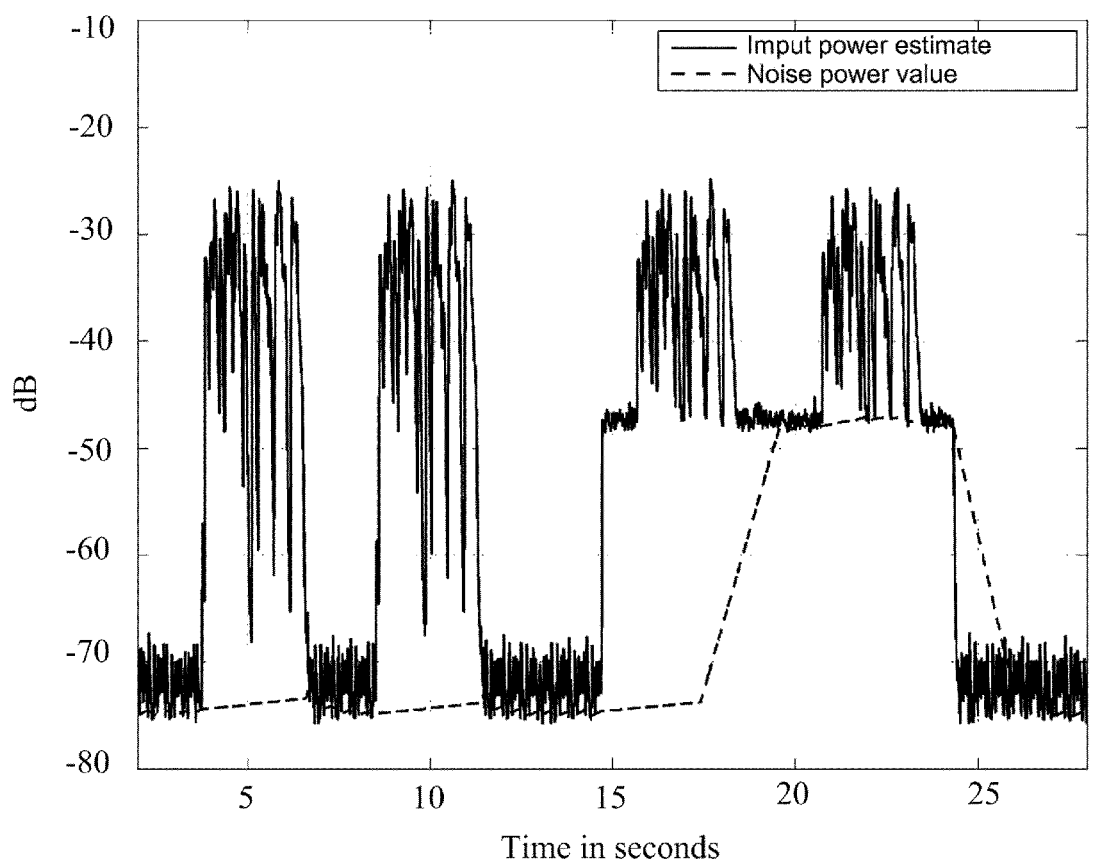
FIG. 8 illustrates a noise power value and an input power estimate plotted over time during a noise attenuation process.
Figure 9:
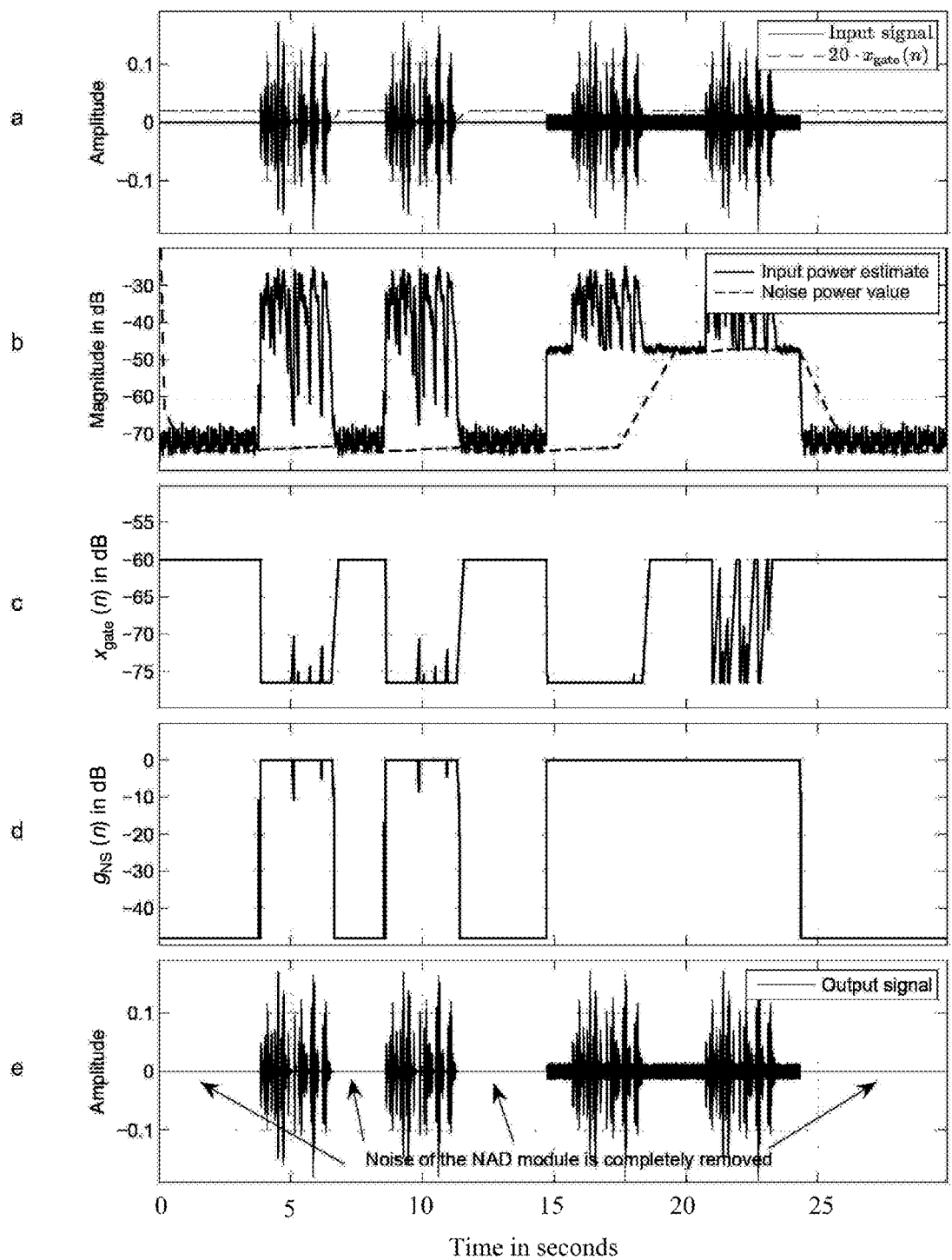
FIG. 9 illustrates an input signal, an input power estimate, a noise power value, an indicator value, an attenuation factor, and an output signal plotted over time during a noise attenuation process.
Figure 10:
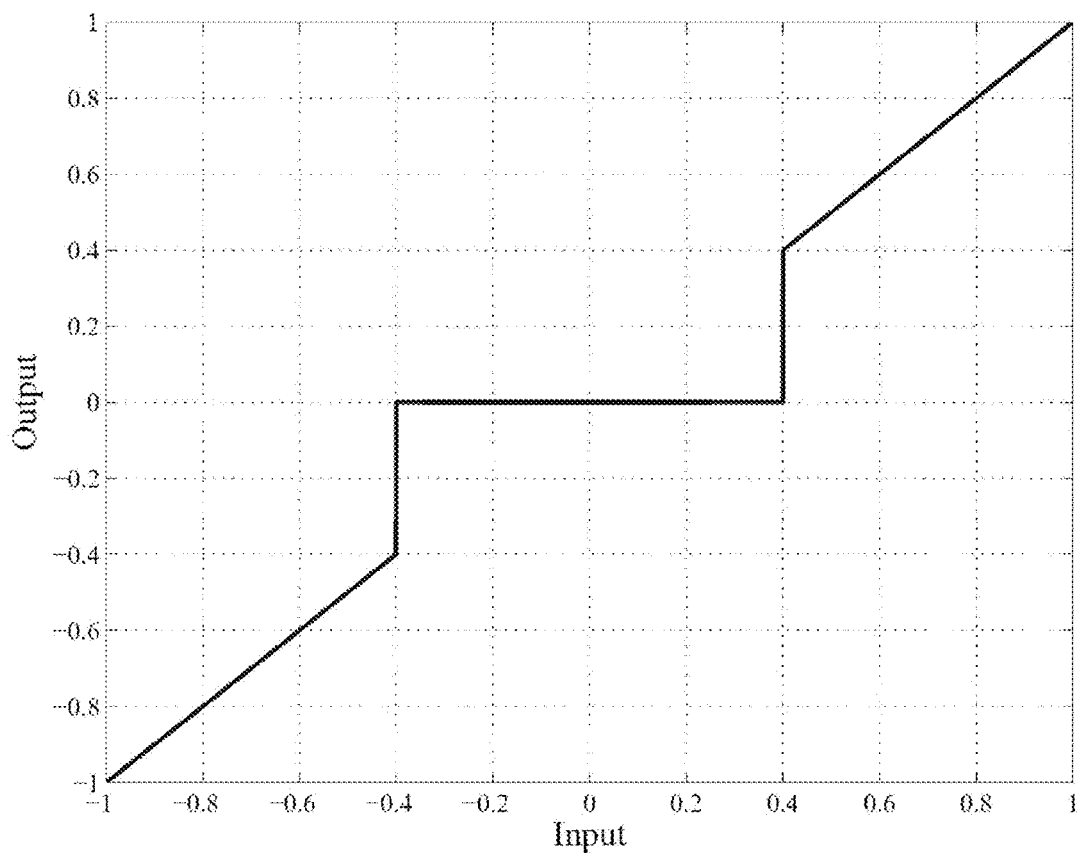
FIG. 10 illustrates one implementation of a noise gate.

FIGS. 8 and 9 illustrate one implementation of the behavior of an input signal, an input power estimate, a noise power value, an indicator value, an attenuation factor, and an output signal plotted over time during a noise attenuation process. In FIG. 9a, the amplitude of an input signal is shown. Four intervals of speech are recorded, and the level of remote noise has been set to zeroes until about 14.5 seconds. The noise level increases to about −47 db in a time interval between about 14.5 and 24 seconds.

The solid line in FIGS. 8 and 9b shows the input power estimate according to equation (2). The dashed line represents the noise power value determined according to equation (3). It can be seen that the noise power value approximates a lower limit of the input power estimate. At a time of about 17.5 seconds, one can observe that the rate with which the noise power value is increased switches from the smaller $\kappa_{inc,s}$ to the larger $k_{inc,f}$ and thus leads to a much steeper incline which continues until a time is reached where the noise power value becomes larger than the input power estimate.

FIG. 9c shows the progress of the indicator value according to equation (4) as derived from the values for the input power estimate and the noise power value illustrated in FIG. 9b. It can be seen that the indicator value is at or near its upper limit $x_{gate,max}$ over periods where no speech component is present in the input signal or where the power estimate for the input signal is clearly above the noise power value. At times where the input power estimate for the input signal is close to the noise power value or is even below it, the indicator value quickly falls to its lower limit of $x_{gate,min}$. The indicator value, multiplied by 20, is also depicted as a dashed line in FIG. 9a, showing that it has a high value during periods where the input signal has a low amplitude.

FIG. 9d illustrates the progress of the attenuation factor as described by equation (5). Over periods where the input power estimate is low, the attenuation factor behaves about inversely to the indicator value, e.g., it rises when the indicator value falls, and it falls when the indicator value rises, and it is at a high value when the indicator value is at a low value, and vice versa. Most of time, the attenuation factor is either at its lower limit $g_{NS,min}$ or at its upper limit $g_{NS,max}$.

However, at the times where the input power estimate is at a high level over an extended period of time, there is a time interval where the indicator value changes to high values, but the attenuation factor does not react to the change by a corresponding decline. This behavior is due to the fact that, according to the presence of $x_p(n)$ in the nominator of the expression for $g_{NS}(n)$ in equation (5), changes in the indicator value have a smaller effect when the value of $x_p(n)$ is high. Hence, the implementation illustrated in FIG. 9 is adapted to attenuating noise where the input power estimate is low. Such a situation may be present if noise is attenuated during pauses of a speech signal. This may happen if the input signal is the speech of a speaker over a telephone line, where the noise of the telephone system is attenuated during speech pauses. Another situation to which the noise attenuation system may be applied is attenuating noise in the reproduction of sound by a high quality amplifier, such as the amplifier of a car stereo system. In this case, noise may be mainly attenuated during passages with low sound level or between two pieces of music.

In FIG. 9e, the output signal corresponding to the input signal of FIG. 9a and generated by the noise attenuation system discussed above is shown. It can be seen that the noise has been dampened or removed from the speech pauses in the periods where the signal level has been low, e.g., in about the first 14 seconds and at times later than about 24 seconds.

Each of the processes described may be encoded in a computer-readable medium such as a memory, programmed within a device such as one or more circuits, one or more processors or may be processed by a controller or a computer. If the processes are performed by software, the software may reside in a memory resident to or interfaced to a storage device, a communication interface, or non-volatile or volatile memory in communication with a transmitter. The memory may include an ordered listing of executable instructions for implementing logic. Logic or any system element described may be implemented through optic circuitry, digital circuitry, through source code, through analog circuitry, or through an analog source, such as through an electrical, audio, or video signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable storage medium," "machine-readable medium," "propagated-signal" medium, and/or "signal-bearing medium" may comprise a medium (e.g., a non-transitory medium) that stores, communicates, propagates, or transports software or data for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection having one or more wires, a portable magnetic or optical disk, a volatile memory, such as a Random Access Memory (RAM), a Read-Only Memory (ROM), an Erasable Programmable Read-Only Memory (EPROM or Flash memory), or an optical fiber. A machine-readable medium may also include a tangible medium, as the software may be electronically stored as an image or in another format (e.g., through an optical scan), then compiled, and/or interpreted or otherwise processed. The processed medium may then be stored in a computer and/or machine memory.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method for attenuating noise in an input signal, comprising:
    receiving the input signal;
    estimating a power level of the input signal to obtain an input power estimate;
    determining a noise power value based on the input power estimate, the noise power value corresponding to an estimate of a noise power within the input signal;
    determining an attenuation factor based on the noise power value; and
    attenuating the input signal using the attenuation factor;
    where determining the attenuation factor comprises determining an indicator value indicating the presence of a wanted signal component in the input signal at a given time, and where the indicator value is increased if the input power estimate at the given time is larger than the product of the noise power value at the given time and a predetermined sensitivity factor.

2. The method according to claim 1, where determining the noise power value comprises determining whether the input power estimate at the given time is larger than the noise power value at a previous time.

3. The method according to claim 1, where determining the noise power value comprises increasing the noise power value at the given time if the input power estimate at the given time is larger than the noise power value at a previous time.

4. The method according to claim 1, where determining the noise power value comprises determining the noise power value at the given time based on the noise power value determined at a previous time and multiplied by an adjustment factor.

5. The method according to claim 1, where determining the noise power value comprises bounding the noise power value below by a predetermined lower noise limit.

6. The method according to claim 1, where over a predetermined period determining the noise power value is performed based on the input power estimate smoothed by a filter.

7. The method according to claim 1, where determining the attenuation factor is based on the input power estimate.

8. The method according to claim 1, where the indicator value is decreased if the input power estimate at the given time is smaller than the product of the noise power value at the given time and a predetermined sensitivity factor.

9. The method according to claim 1, where the indicator value is bounded above by a predetermined indicator maximum value, bounded below by a predetermined indicator minimum value, or both.

10. The method according to one of claim 1, where the attenuation factor is based on a quotient of the indicator value and the input power estimate.

11. The method according to one of claim 10, where the attenuation factor is time dependent.

12. The method according to claim 1, where the acts of estimating the power of the input signal, determining the noise power value, determining the attenuation factor, and attenuating the input signal are repeated at successive points in time.

13. The method according to claim 1, where the input signal comprises an acoustic wanted signal component.

14. The method according to claim 1, where the attenuation factor is bounded by a predetermined attenuation minimum value, a predetermined attenuation maximum value, or both.

15. The method according to claim 1, where attenuating the input signal comprises attenuating the input signal at a noise attenuator that comprises circuitry, a computer-readable storage medium with computer-executable instructions embodied thereon, or both.

16. A method for attenuating noise in an input signal, comprising:
    receiving the input signal;
    estimating a power level of the input signal to obtain an input power estimate;
    determining a noise power value based on the input power estimate, the noise power value corresponding to an estimate of a noise power within the input signal;
    determining an attenuation factor based on the noise power value; and
    attenuating the input signal using the attenuation factor;
    where determining the attenuation factor comprises determining an indicator value indicating the presence of a wanted signal component in the input signal at a given time, and where the indicator value is decreased if the input power estimate at the given time is smaller than the product of the noise power value at the given time and a predetermined sensitivity factor.

17. A computer program product comprising one or more non-transitory computer-readable storage media having computer-executable instructions embodied thereon and programmed to:
    receive the input signal;
    estimate a power of the input signal to obtain an input power estimate;
    determine a noise power value based on the input power estimate, the noise power value corresponding to an estimate of a noise power within the input signal;
    determine an attenuation factor based on the noise power value; and
    attenuate the input signal using the attenuation factor;
    where the computer-executable instructions programmed to determine the attenuation factor comprise computer-executable instructions programmed to determine an indicator value indicating the presence of a wanted signal component in the input signal at a given time, and where the indicator value is increased if the input power estimate at the given time is larger than the product of the noise power value at the given time and a predetermined sensitivity factor.

18. An apparatus for attenuating noise, comprising:
    means for receiving an input signal;
    means for estimating a power of the input signal to obtain an input power estimate;

means for determining a noise power value based on the input power estimate, the noise power value corresponding to an estimate of a noise power within the input signal;

means for determining an attenuation factor based on the noise power value; and means for attenuating the input signal using the attenuation factor;

where the means for determining the attenuation factor comprises means for determining an indicator value indicating the presence of a wanted signal component in the input signal at a given time, and where the indicator value is increased if the input power estimate at the given time is larger than the product of the noise power value at the given time and a predetermined sensitivity factor.

19. A computer program product comprising one or more non-transitory computer-readable storage media having computer-executable instructions embodied thereon for:

estimating a power level of an input signal to obtain an input power estimate;

determining a noise power value based on the input power estimate, the noise power value corresponding to an estimate of a noise power within the input signal;

adjusting the noise power value over time based on a comparison between the input power estimate and the noise power value;

determining an indicator value indicating the presence of a wanted signal component in the input signal;

adjusting the indicator value over time based on a comparison between the input power estimate and a product of the noise power value and a sensitivity factor;

determining an attenuation factor based on the indicator value and the input power estimate; and attenuating the input signal using the attenuation factor.

20. The computer program product of claim 19, where the instructions for adjusting the noise power value comprise instructions for:

comparing the input power estimate for a first portion of the input signal with the noise power value for a preceding portion of the input signal;

decreasing the noise power value for the first portion of the input signal when the input power estimate for the first portion of the input signal is less than the noise power value for the preceding portion of the input signal; and increasing the noise power value for the first portion of the input signal when the input power estimate for the first portion of the input signal is greater than the noise power value for the preceding portion of the input signal.

21. The computer program product of claim 19, where the instructions for adjusting the indicator value comprise instructions for:

comparing the input power estimate and the product of the noise power value and the sensitivity factor;

increasing the indicator value when the input power estimate is less than the product of the noise power value and the sensitivity factor; and decreasing the indicator value when the input power estimate is greater than the product of the noise power value and the sensitivity factor.

22. The computer program product of claim 19, where the instructions for determining the attenuation factor comprise instructions for:

calculating an attenuation factor candidate based on a quotient of the indicator value and the input power estimate; and setting the attenuation factor to the attenuation factor candidate when the attenuation factor candidate falls between an attenuation factor minimum and an attenuation factor maximum.

23. A method for attenuating noise in an input signal, comprising:

receiving the input signal;

estimating a power level of the input signal to obtain an input power estimate;

determining a noise power value based on the input power estimate, the noise power value corresponding to an estimate of a noise power within the input signal;

determining an attenuation factor based on the noise power value; and attenuating the input signal using the attenuation factor;

where determining the attenuation factor comprises determining an indicator value indicating the presence of a wanted signal component in the input signal at a given time, and where the attenuation factor is based on a quotient of the indicator value and the input power estimate.

* * * * *